US 7,317,350 B2

(12) United States Patent
Armit

(10) Patent No.: US 7,317,350 B2
(45) Date of Patent: Jan. 8, 2008

(54) TRANSRESISTANCE AMPLIFIER FOR A CHARGED PARTICLE DETECTOR

(75) Inventor: Andrew Philip Armit, Haslingfield (GB)

(73) Assignee: Carl Zeiss SMT Limited, Cambridge (GB)

( * ) Notice: Subject to any disclaimer, the term of this patent is extended or adjusted under 35 U.S.C. 154(b) by 189 days.

(21) Appl. No.: 10/515,213

(22) PCT Filed: May 15, 2003

(86) PCT No.: PCT/GB03/02089

§ 371 (c)(1),
(2), (4) Date: Jun. 17, 2005

(87) PCT Pub. No.: WO03/103138

PCT Pub. Date: Dec. 11, 2003

(65) Prior Publication Data

US 2005/0264351 A1    Dec. 1, 2005

(30) Foreign Application Priority Data

May 31, 2002    (GB) .................................. 0212601.9

(51) Int. Cl.
*H03F 17/00*    (2006.01)
*G11C 11/44*    (2006.01)
*H03F 3/12*    (2006.01)

(52) U.S. Cl. ...................................... 330/59; 330/61 R

(58) Field of Classification Search ................ 250/310; 330/59, 61 R
See application file for complete search history.

(56) References Cited

U.S. PATENT DOCUMENTS

| 3,379,991 | A | | 4/1968 | Clerc |
| 3,919,550 | A | | 11/1975 | Banbury |
| 4,061,431 | A | * | 12/1977 | Toyoda ........................ 356/227 |
| 4,268,137 | A | * | 5/1981 | Cocron et al. .............. 396/129 |
| 5,623,284 | A | * | 4/1997 | Hsu et al. .................... 345/166 |
| 5,949,225 | A | * | 9/1999 | Sawtell ........................ 323/284 |
| 6,888,140 | B2 | * | 5/2005 | Hayn .......................... 250/311 |
| 2006/0050032 | A1 | * | 3/2006 | Gunner et al. ................. 345/82 |

FOREIGN PATENT DOCUMENTS

DE    3607688 A1    9/1987

OTHER PUBLICATIONS

Teder, "Field-Effect Optocoupler", Elektor Electronics, vol. 13, No. 142, Feb. 1, 1987, pp. 58-60.
Woodward, "the Many Analog Uses For Optical Isolators", Electronic Design, vol. 43, No. 8, Apr. 17, 1995, pp. 101-108.

* cited by examiner

*Primary Examiner*—Nikita Wells
*Assistant Examiner*—Johnnie L Smith, II
(74) *Attorney, Agent, or Firm*—Barnes & Thornburg

(57) ABSTRACT

Disclosed is a transresistance amplifier for a charged particle detector, comprising a variable input resistance, which may be a phototransistor (IC3), a voltage amplification stage (IC1) and control means (IC3), operable to vary the variable input resistance. The variable input resistance includes a first light-dependent resistance and the control means includes a first variable intensity light source that is optically coupled to the first light-dependent resistance. Also disclosed is a charged particle detector that includes such a transresistance amplifier and an electron microscope that includes such a charged particle detector.

20 Claims, 8 Drawing Sheets

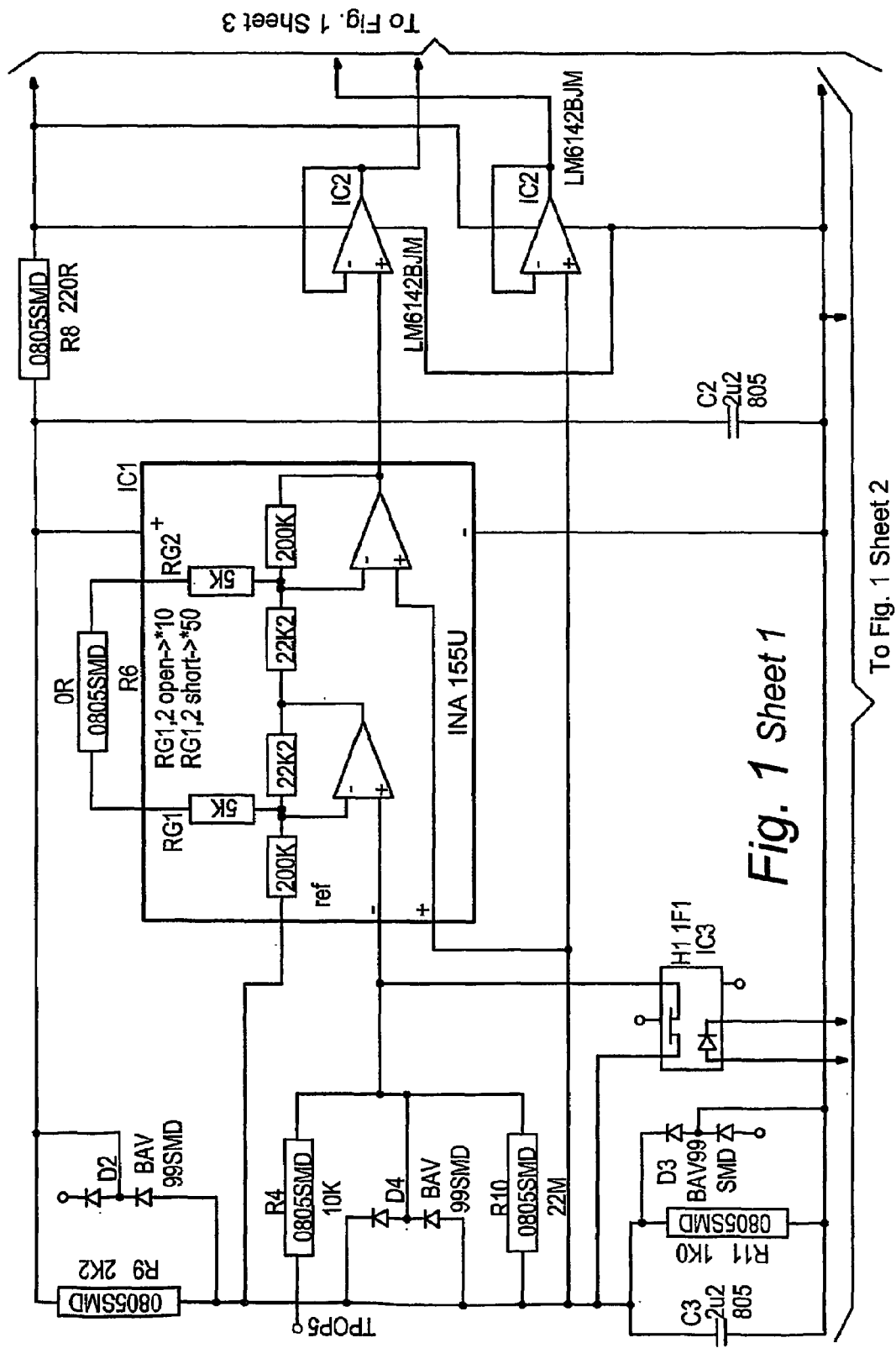
Fig. 1 Sheet 1

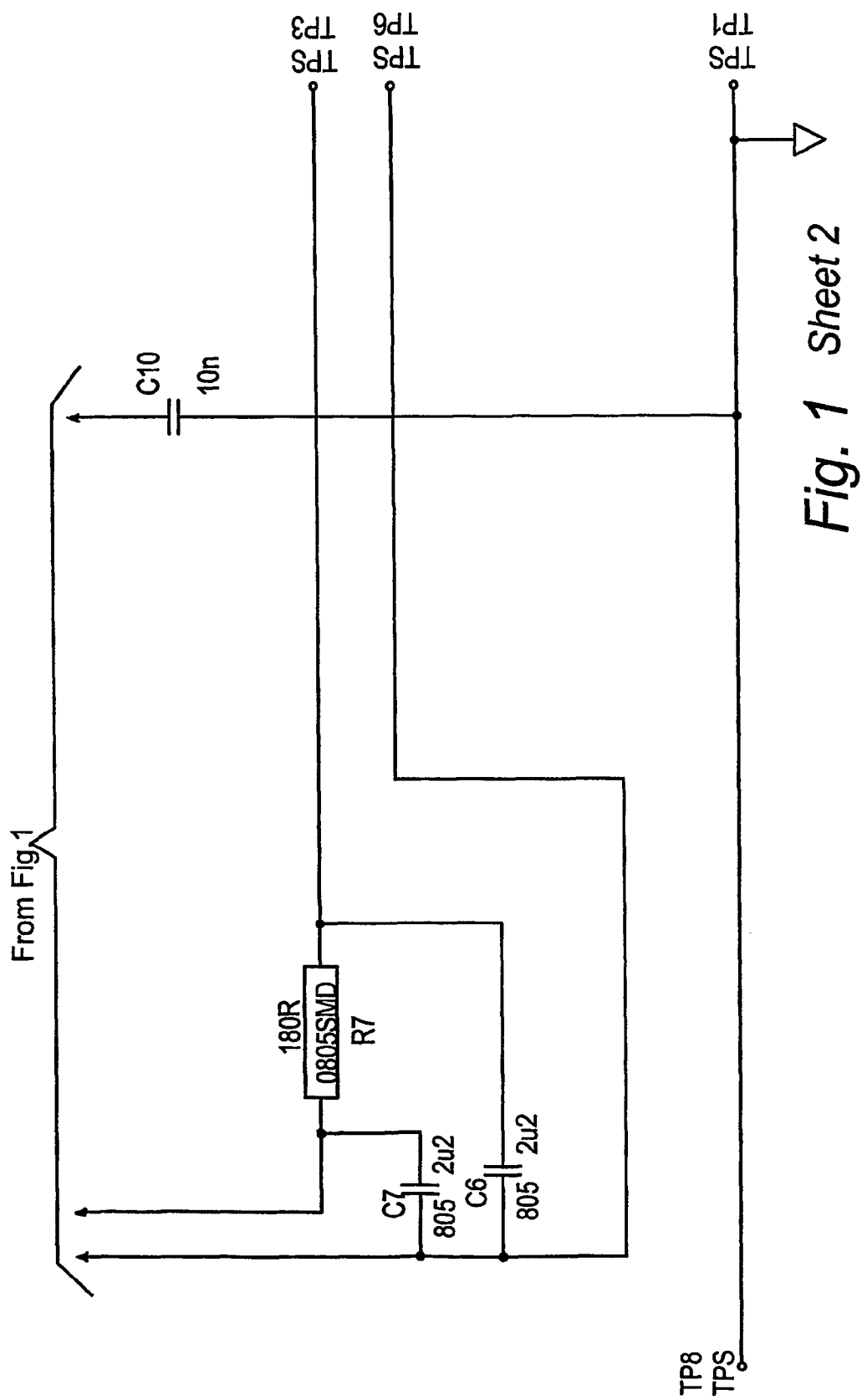
Fig. 1 Sheet 2

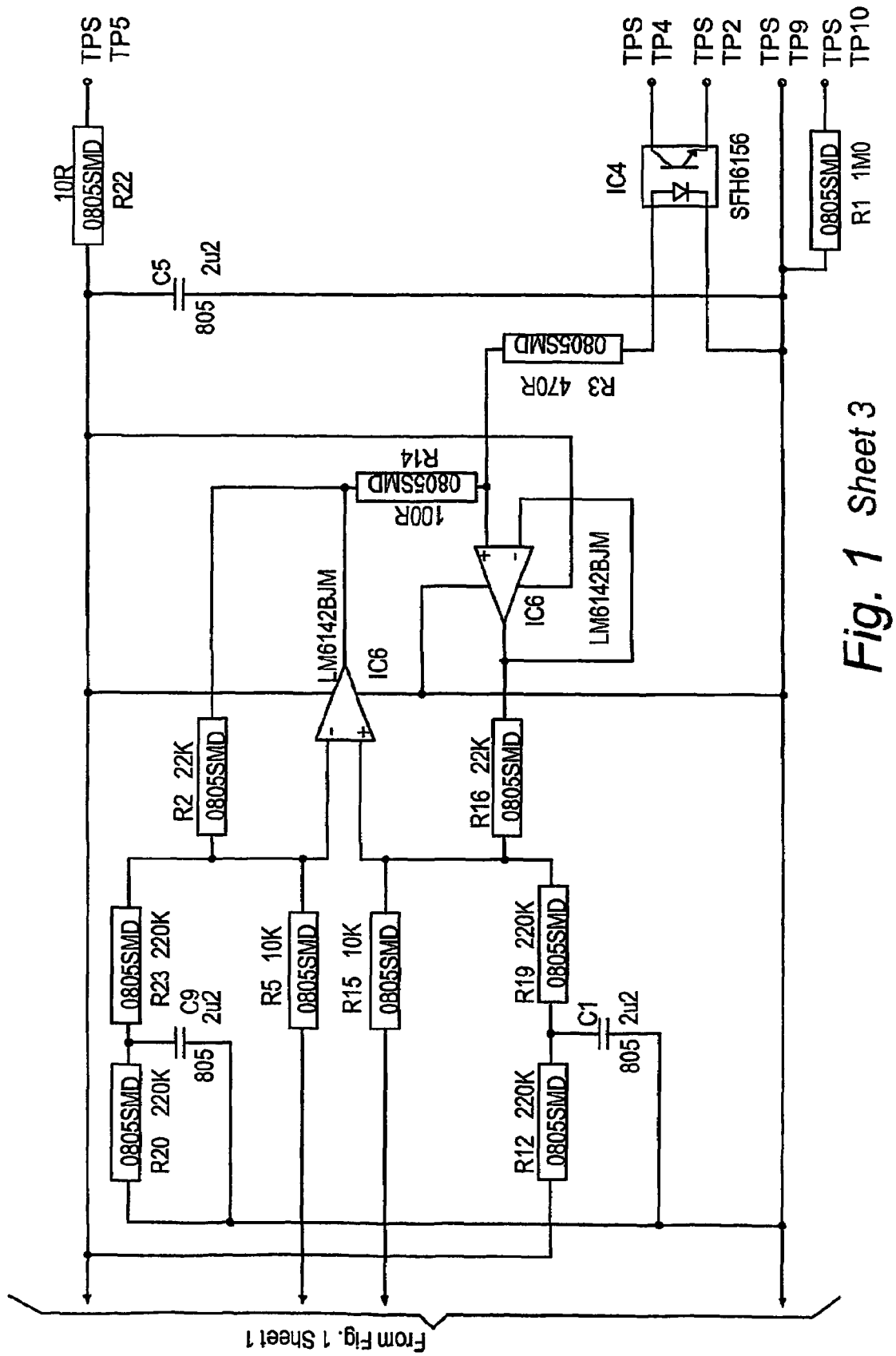
Fig. 1 Sheet 3

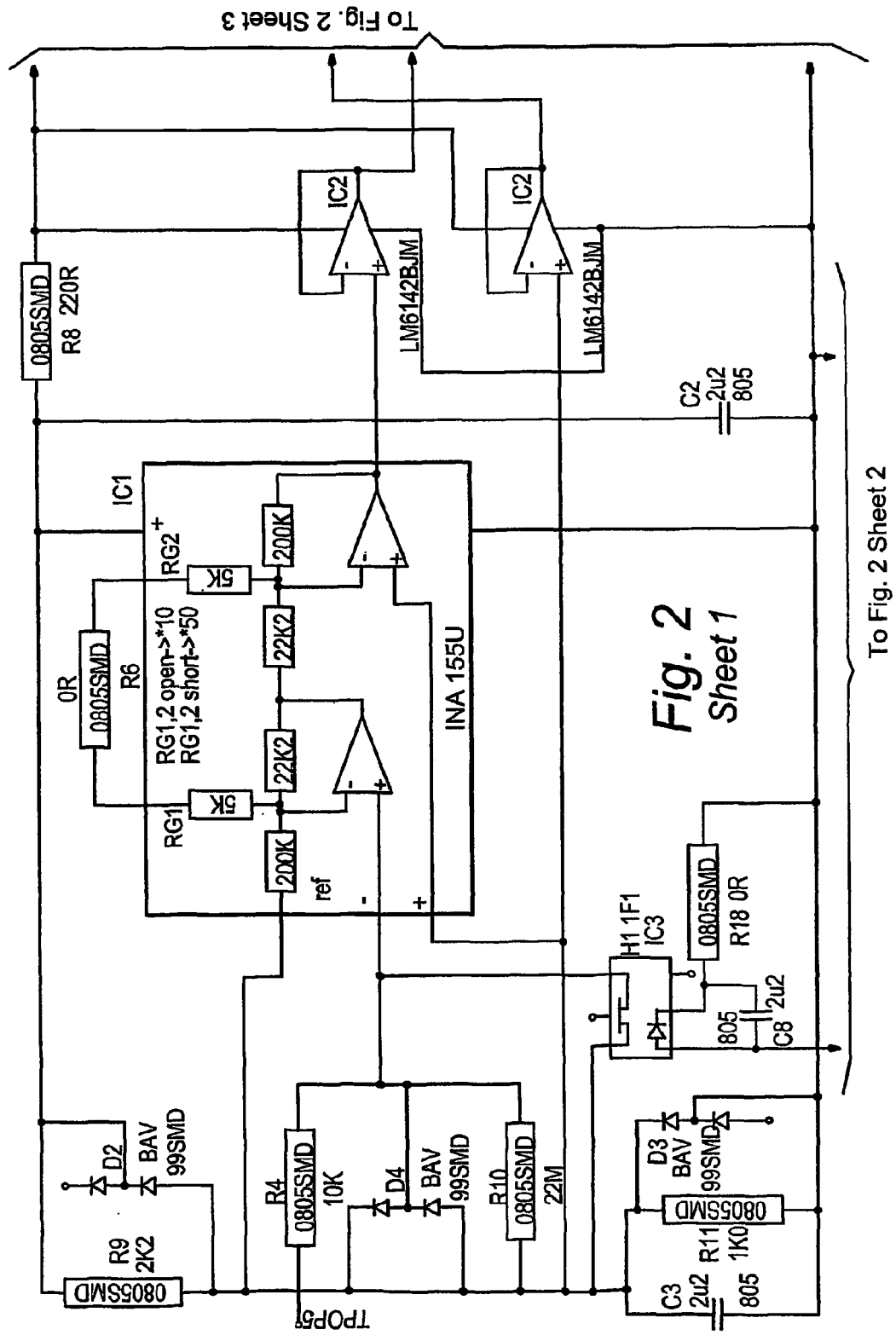
Fig. 2 Sheet 1

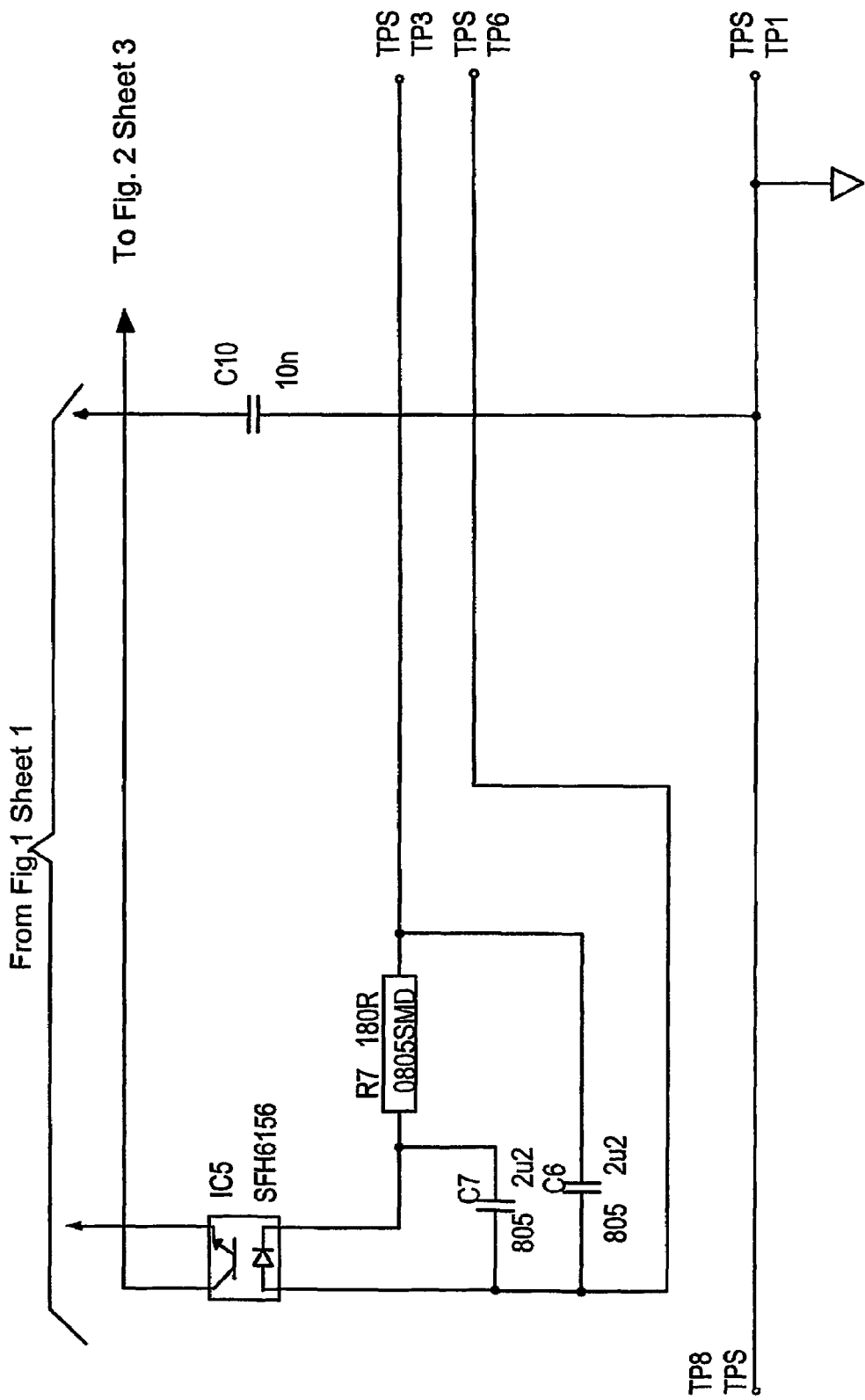
Fig. 2 Sheet 2

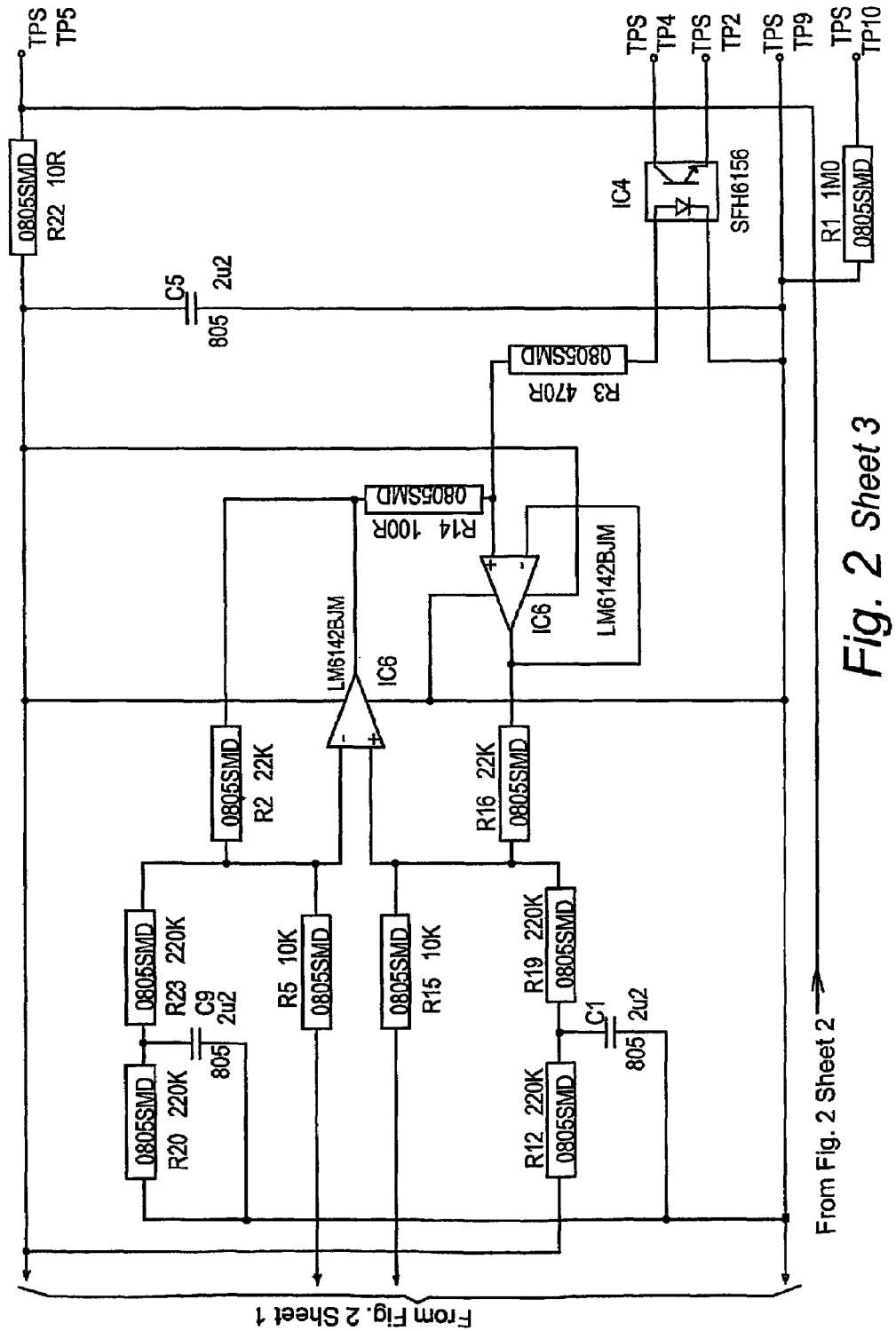
Fig. 2 Sheet 3

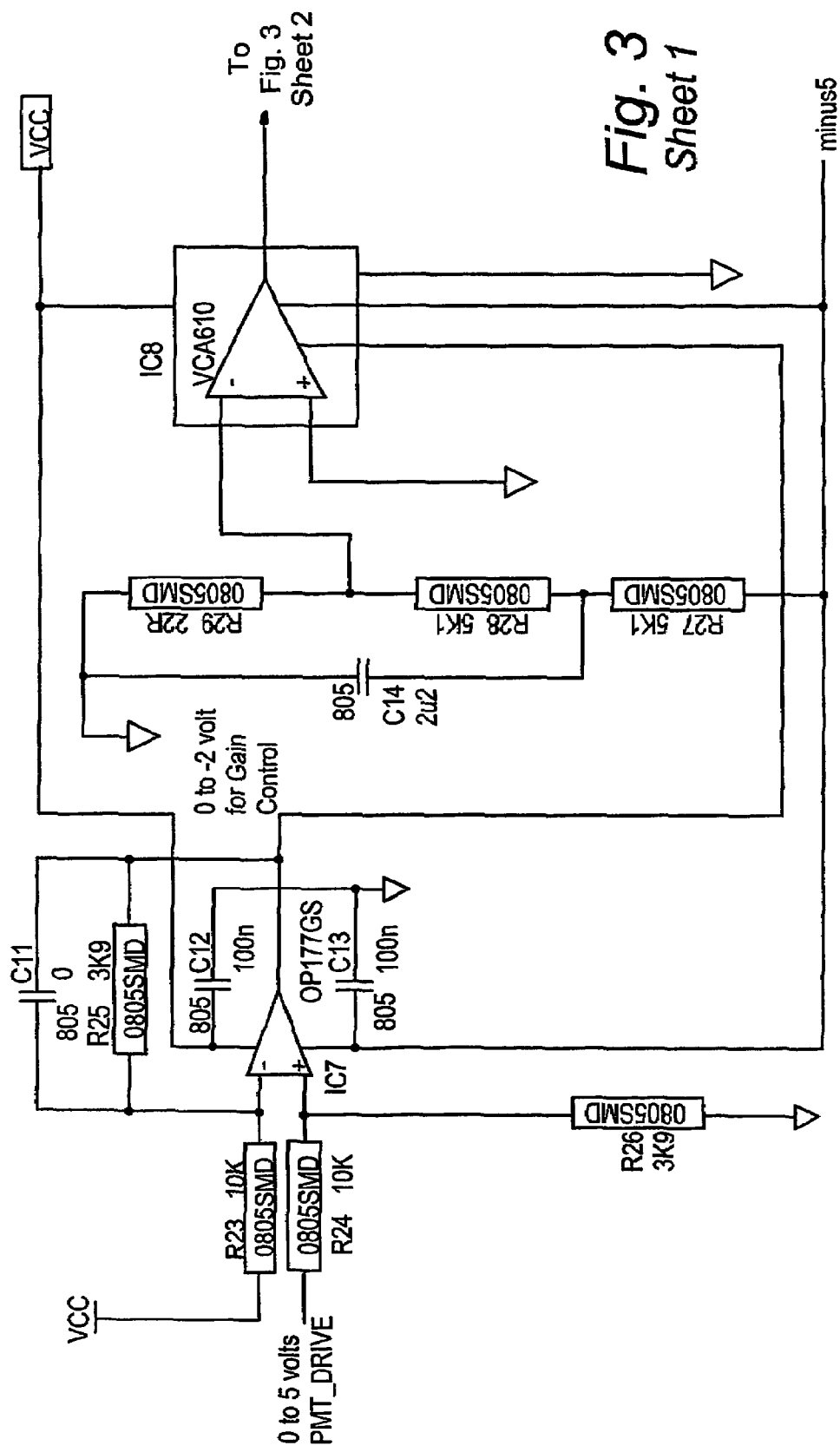
Fig. 3 Sheet 1

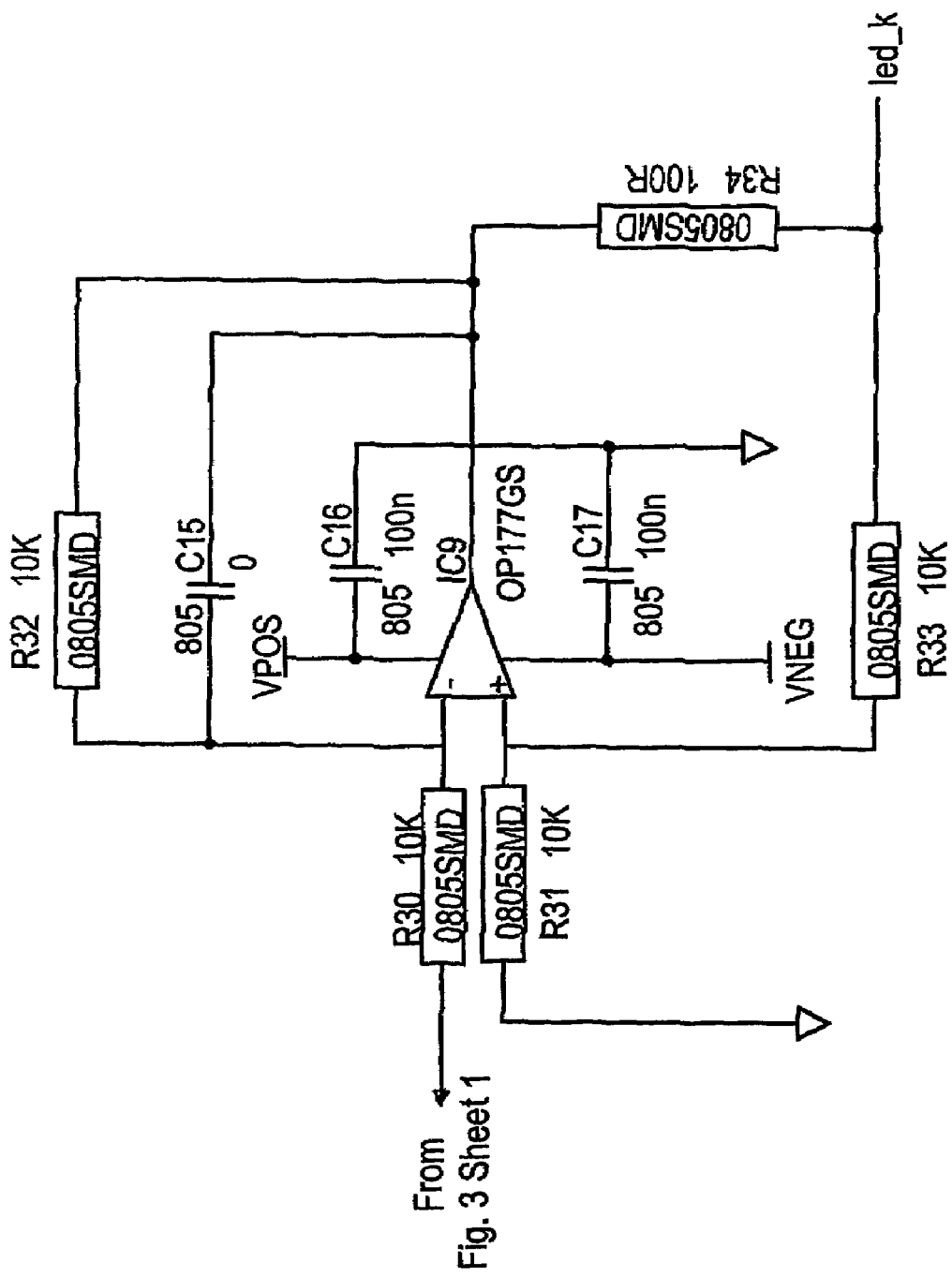
Fig. 3 Sheet 2

TRANSRESISTANCE AMPLIFIER FOR A CHARGED PARTICLE DETECTOR

FIELD OF THE INVENTION

This invention relates to a transresistance amplifier for use in a charged particle detector, to a charged particle detector that includes such a transresistance amplifier, and to an electron microscope that includes such a charged particle detector.

BACKGROUND TO THE INVENTION

Charged particle detectors are well known, and typically comprise an electrode, means for establishing an electric field in the vicinity of the electrode so as to attract charged particles towards the electrode, and a transresistance amplifier for converting an input current made up of charged particles incident on the electrode into an output voltage.

The transresistance amplifier typically comprises an input resistance through which the input current flows so as to develop an input voltage, and a voltage amplifier that receives the input voltage and generates the output voltage.

The input voltage received by the voltage amplifier inevitably comprises both the signal component developed across the input resistance and a small noise component. The magnitude of the noise component is approximately constant, regardless of the magnitude of the signal component. From the point of view of the signal-to-noise ratio of the output voltage, therefore, it is desirable for the input resistance, and hence the input voltage, to be as large as possible.

The voltage amplifier has some input capacitance, which, together with the input resistance, forms a low-pass filter, the cut-off frequency of which is inversely proportional to the input resistance. From the point of view of the bandwidth of the output voltage, therefore, it is desirable for the input resistance of the amplifier to be as small as possible.

Given these conflicting requirements, previous transresistance amplifiers have been provided with a voltage amplifier with variable gain and several switchable input resistances, any one of which may be connected, typically by means of a relay, between the electron detector and the voltage amplifier. The variable gain of the voltage amplifier is necessary to accommodate the step changes in sensitivity resulting from the use of switchable input resistances.

SUMMARY OF THE INVENTION

According to a first aspect of the invention there is provided a transresistance amplifier for a charged particle detector, the transresistance amplifier comprising a variable input resistance, a voltage amplification stage and control means operable to vary the variable input resistance, wherein the variable input resistance includes a first light-dependent resistance and the control means includes a first variable intensity light source that is optically coupled to the first light-dependent resistance.

The invention therefore provides a transresistance amplifier the transresistance of which is continuously variable over its range of adjustment, and which avoids the discontinuity of bandwidth of previous transresistance amplifiers using several switchable input resistances.

Moreover, the invention provides a transresistance amplifier that is easier to use than previous transresistance amplifiers, since the gain of the voltage amplification stage does not have to be varied, so that a user of a charged particle detector including the transresistance amplifier need concern himself only with adjusting the input resistance.

The first light-dependent resistance may advantageously comprise a light-dependent resistor made from cadmium sulphide, cadmium selenide or other photoconductive material. In general a change in resistance of such a material in response to a change in intensity of illumination takes several seconds. Thus, although a light-dependent resistor may be used where the variation of the input resistance of the transresistance amplifier is to be carried out manually by a user of the transresistance amplifier, the light-dependent resistor might be unsuitable for use in conjunction with a closed-loop control system, where the slow speed of response might cause instability of the control system.

Alternatively the light-dependent resistance may advantageously comprise a photodiode, an element that has a faster speed of response than a light dependent resistor.

Preferably, however, the light-dependent resistance comprises a phototransistor, and most preferably a photo field-effect transistor (photo FET), a channel of which forms the variable input resistance and a gate region of which is optically coupled to the first variable intensity light source. The photo FET provides a resistance that is variable typically from approximately 300 ohms to some hundreds of megohms.

The first variable intensity light source may advantageously comprise a first light-emitting diode (LED). In preferred embodiments of the invention the first LED and photo FET both form parts of a first opto-coupler.

The first opto-coupler typically has an impedance of some $10^{11}$ ohms of isolation with a capacitance of approximately 2 picofarads between the first LED and the photo FET.

It has been found that minute noise currents flowing in the circuit containing the first LED can flow through the first opto-isolator to the photo FET, and that the voltages developed by the noise currents across the isolation impedance are comparable with the input voltage developed across the photo FET by the input current, which is typically of the order of picoamps.

Thus the transresistance amplifier may advantageously further comprise a second light-dependent resistance, and a second variable intensity light source optically coupled to the second light-dependent resistance, the second light-dependent resistance being electrically connected to the first variable intensity light source, such that variation of the second light-dependent resistance varies a flow of current through the first variable intensity light source.

Preferably the second light-dependent resistance is connected in series with the first variable intensity light source.

The second light dependent resistance may advantageously comprise a phototransistor, and preferably a photo bipolar junction transistor (photo BJT), a base region of which is optically coupled to the second variable intensity light source.

The second variable intensity light source may advantageously comprise a second LED. In one of the preferred embodiments of the invention the second LED and photo BJT both form parts of a second opto-coupler. The second LED and photo BJT give approximately unity current gain, which facilitates control of the input resistance of the transresistance amplifier.

The second opto-coupler typically provides some $10^{11}$ ohms of isolation and a capacitance of approximately 0.4 picofarads between the second LED and the photo BJT.

By including the second opto-coupler in the circuit containing the first LED, the impedance between the electrode and the control circuit is increased by the isolation impedance of the second opto-coupler and undesired cross-coupling is reduced accordingly.

Preferably the transresistance amplifier further comprises a capacitor electrically connected to the photo BJT so as to form a low-pass filter that passes dc control currents from the photo BJT to the first LED, but attenuates higher frequency noise currents.

Thus it has been realised that the capacitance between the second LED and photo BJT of the second opto-coupler may be used to form a potential divider with an additional capacitor with a larger capacitance than that of the second opto-coupler, and that the attenuation of higher frequency noise currents is given approximately by the ratio of the capacitances of the second opto-coupler and the additional capacitor.

The resistance of the photo FET varies exponentially with respect to current flowing through the first LED, which can make manual control of the transresistance of the transresistance amplifier difficult for users.

The transresistance amplifier may therefore advantageously further comprise a control circuit having input means operable to generate an input signal representative of a required transresistance of the transresistance amplifier, means for generating an output current logarithmically related to the input signal, the control circuit being electrically connected to the first or second LED such that the output current flows through said first or second LED to obtain the required transresistance.

In preferred embodiments of the invention the input means comprises a digital-to-analogue converter, but a potentiometer could equally well be used.

According to a second aspect of the invention there is provided a charged particle detector comprising an electrode, means for establishing an electric field in the vicinity of the electrode, and a transresistance amplifier in accordance with the first aspect of the invention.

According to a third aspect of the invention there is provided an electron microscope comprising a specimen chamber for receiving a specimen, an electron gun, an electron detector in accordance with the second aspect of the invention, and video means operable to receive an output voltage from the transresistance amplifier and to generate therefrom an image of a specimen.

Preferably the transresistance amplifier is contained within the specimen chamber.

The invention therefore further provides a transresistance amplifier, which, by virtue of its avoidance of the use of switchable input resistances and relays, can be made smaller than has previously been possible, and can therefore be accommodated within the specimen chamber of the electron microscope, thereby reducing the distance that the input current must be transmitted from the electrode to the transresistance amplifier, and hence the level of interference to which the input current is subjected.

The invention will now be described in greater detail by way of illustrative examples and with reference to the accompanying drawings, in which:

FIG. 1 is a circuit diagram of an amplifier for use in an electron microscope, which includes a first transresistance amplifier in accordance with the first aspect of the invention;

FIG. 2 is a circuit diagram of the amplifier of FIG. 1, in which the first transresistance amplifier has been replaced by a second transresistance amplifier; and FIG. 3 is a circuit diagram of a control circuit for use in conjunction with the amplifiers of FIGS. 1 and 2.

DETAILED DESCRIPTION OF EMBODIMENTS

The amplifier of FIG. 1 comprises four stages, a transresistance amplifier, a buffer amplifier, a transconductance amplifier and a photo BJT opto-coupler.

In use power is supplied to the amplifier from a floating 5 volt power supply, the positive terminal being indicated in FIG. 1 by TP5 and the negative terminal by TP9. A first low-pass filter is formed by resistor R22 and capacitor C5, and a second low-pass filter by resistor R8 and capacitor C2. The first and second low-pass filters smooth the power supply voltage. Resistors R9 and R11 form a potential divider that establishes a reference voltage for both the transresistance amplifier and transconductance amplifier. Capacitor C3 smoothes the reference voltage.

The 5 volt power supply for the amplifier floats on a 40 volt power supply. A positive terminal of the 40 volt power supply is indicated by TP10 in FIG. 1 and is used to establish an electric field in the vicinity of an electrode (not shown) in a specimen chamber of an electron microscope, such that electrons are attracted towards the electrode. A negative terminal of the 40 volt power supply is indicated by TP1 and is connected to the chamber (not shown) of the electron microscope (not shown), and to ground.

Capacitor C10 provides a low impedance path to ground for high frequency noise at the negative terminal of the 5 volt power supply. Resistor R1 ties the negative terminal of the 5 volt power supply to the positive terminal of the 40 volt power supply.

The transresistance amplifier is made up of current limiting resistor R4, input resistor R10, photo FET opto-coupler IC3, voltage amplifier IC1, current limiting resistor R7 and capacitors C6 and C7. The operation of the transresistance amplifier is as follows.

Electrons incident upon the electrode (not shown) electrically connected to the input TPOP5 flow through the current limiting resistor R4, then through the parallel arrangement of the input resistor R10 and channel of the photo FET of the opto-coupler IC3 to the junction of resistors R9 and R11, at which the reference voltage is established. This corresponds to a flow of conventional current of picoamp order from the junction of the resistors R9 and R11 to the electrode. The voltage amplifier IC1 has differential inputs, one of which is connected to the junction of the resistors R9 and R1, and the other to the more negative terminals of the input resistor R10 and channel of the photo FET of the opto-coupler IC3. The more positive terminals of the input resistor and channel of the photo FET are connected to the junction of the resistors R9 and R11. Thus the voltage developed across the parallel arrangement of the input resistor R10 and channel of the photo FET is applied to the differential inputs of the voltage amplifier IC1.

The resistance of the channel of the photo FET of the opto-coupler IC3 is determined by the intensity of illumination of the LED of the opto-coupler IC3, which itself is determined by the current flowing through the LED. Control of the current through the LED is by means of a control circuit that is described below in relation to FIG. 3.

The current limiting resistor R7 prevents damage to the LED of the opto-coupler IC3 in the event of the input to the LED circuit, indicated by TP6, being inadvertently short-circuited to the positive terminal of either power supply. Capacitors C7 and C6 attenuate noise coupled into the circuit containing the LED of the opto-coupler IC3.

The current limiting resistor R4 limits the current that can be drawn from the 5 volt power supply in the event of the electrode becoming short-circuited to the grounded chamber of the electron microscope. In the event of such a short-circuit the lower of the two diodes designated in FIG. 1 by D4 goes into conduction, preventing the differential input to the transresistance amplifier from exceeding one forward diode voltage drop. In the event of a short-circuit between the positive terminal of the 40 volt power supply and the electrode, the upper of the two diodes designated in FIG. 1 by D4 goes into conduction, again so as to prevent the differential input to the transresistance amplifier from exceeding one forward diode voltage drop. In the event of either such short-circuit the diode D3 prevents the reference voltage from dropping more than one forward diode voltage drop below the negative terminal of the power supply, and the diode D2 prevents the reference voltage from rising more than one forward diode voltage drop above the positive terminal of the power supply.

The buffer amplifier is made up of two unity gain operational amplifiers, both of which are designated IC2 in FIG. 1 because they are formed as a single integrated circuit to improve their thermal tracking. The upper operational amplifier buffers the output voltage from the transresistance amplifier, and the lower operational amplifier buffers the reference voltage.

The purpose of buffering of the output and reference voltages is explained below in relation to the transconductance amplifier.

The transconductance amplifier is made up of first and second operational amplifiers, both of which are designated IC6 in FIG. 1 because they are formed as a single integrated circuit, a first biasing network comprising resistors R20, R23, and R5 together with smoothing capacitor C9, a second biasing network comprising resistors R12, R19, and R15 together with smoothing capacitor C1, first and second feedback resistors R2 and R16 respectively, and load resistor R14.

The first biasing network forms a potential divider between the buffered reference voltage and the negative terminal of the 5 volt power supply, the voltage developed across resistors R20 and R23 being applied to the inverting input of the upper operational amplifier. The second biasing network forms a potential divider between the output of the first low-pass filter and the buffered output voltage from the transresistance amplifier, the voltage developed across resistor R15 being applied to the non-inverting input of the upper operational amplifier.

The buffering of the output and reference voltages by the buffer amplifier ensures that the bias voltages applied to the upper operational amplifier of the transconductance amplifier by the first and second biasing networks are not affected by the output and reference voltages.

The output voltage of the upper operational amplifier is applied to a first terminal of the load resistor R14 so as to produce the output current of the transconductance amplifier. A second terminal of the load resistor R14 is connected to the non-inverting input of the lower operational amplifier IC6. The lower operational amplifier buffers the voltage at the second terminal of the load resistor R14, so as to ensure that the bias voltage at the non-inverting input of the upper operational amplifier is not affected by the voltage developed across the load resistor R14.

The LED of the photo BJT opto-coupler IC4 receives the output current of the transconductance amplifier via the current limiting resistor R3, which serves the same purpose as the current limiting resistor R7. A current of magnitude equal to that which flows through the LED flows through the photo BJT of the opto-coupler IC4. The photo BJT opto-coupler IC4 is used because of its unity current gain. The current flowing through the photo BJT flows through an input resistance (not shown) across which a voltage is developed for application to the input of a video amplifier (not shown).

The current gain of the opto-coupler IC4 is not unity when the current through the LED is zero. For this reason the bias voltages are applied to the inputs of the upper operational amplifier of the transconductance amplifier, so that even when no signal is present at the input to the transresistance amplifier, there is nevertheless an output current from the transconductance amplifier, resulting in an output voltage at the input to the video amplifier that sets the "black" or no signal level, and thereby preserves the unity current gain of the opto-coupler over the signal range in which it is used.

Turning next to the amplifier of FIG. 2, this also comprises a transresistance amplifier, a buffer amplifier, a transconductance amplifier and a photo BJT opto-coupler. The buffer amplifier, transconductance amplifier and photo BJT opto-coupler are identical with those of the amplifier of FIG. 1.

However, the transresistance amplifier shown in FIG. 2 comprises, in addition to those elements that make up the transresistance amplifier shown in FIG. 1, a photo BJT opto-coupler IC5 and a capacitor C8.

The photo BJT of the opto-coupler IC5 is connected between the positive terminal of the 5 volt power supply and the anode of the LED of the opto-coupler IC3. The cathode of the LED of the opto-coupler IC3 is connected to the negative terminal of the 5 volt power supply. The capacitor C8 is connected between the junction of the photo BJT of the opto-coupler IC5 and the anode of the LED of the opto-coupler IC3, and the negative terminal of the 5 volt power supply.

A control current applied to the input TP6 to the circuit containing the LED of the opto-coupler IC5 causes a current of equal magnitude to flow through the photo BJT of opto-coupler IC5 and LED of opto-coupler IC3, which current controls the resistance of the channel of the photo FET of opto-coupler IC3, as previously described.

However, high frequency noise coupled into the circuit containing the LED of opto-coupler IC5 (which in the amplifier of FIG. 1 would have been coupled into the circuit containing the LED of opto-coupler IC3) are considerably attenuated, because the minute capacitance between the LED and photo BJT of opto-coupler IC5 and the capacitor C8 form a potential divider which prevents most of the high frequency noise from reaching the LED of the opto-coupler IC3.

Turning finally to FIG. 3, the control circuit comprises a digital-to-analogue converter (DAC) (not shown in FIG. 3), a voltage amplifier, a logarithmic amplifier and a transconductance amplifier. The control circuit is supplied by −5 and +5 volt power supplies.

The voltage amplifier is made up of operational amplifier IC7, first biasing network comprising resistors R23 and R25, and second biasing network comprising resistors R24 and R26. Capacitor C11 smoothes the bias voltage at the inverting input of the operational amplifier IC7, and capacitors C12 and C13 smooth the power supply voltages.

The logarithmic amplifier is made up of a logarithmic amplifier integrated circuit (IC) IC8 and a biasing network comprising resistors R27, R28 and R29. Capacitor C14 smoothes the bias voltage at the inverting input of the logarithmic amplifier IC IC8.

The transconductance amplifier comprises an operational amplifier IC9, first biasing network comprising resistors R30 and R32, second biasing network comprising resistors R31 and R33, and load resistor R34. Capacitor C15 smoothes the bias voltage at the inverting input of the operational amplifier IC9, and capacitors C16 and C17 smooth the power supply voltages.

The DAC supplies a 0 to 5 volt control voltage to the non-inverting input of the operational amplifier IC7 of the voltage amplifier. The operational amplifier generates a 0 to −2 volt output voltage proportional to the control voltage.

The logarithmic amplifier has a bias voltage of −10 millivolts applied to its inverting input by the biasing network comprising resistors R27, R28 and R29, and the non-inverting input is connected to ground. The output of the voltage amplifier is connected to a control voltage input of the logarithmic amplifier IC IC8, which produces an output voltage logarithmically related to the control voltage.

The output voltage from the logarithmic amplifier IC IC8 is connected to the inverting input of the transconductance amplifier, which produces an output current through the load resistor R34 that is logarithmically related to the control voltage.

The load resistor is connected to the cathode of the LED of the opto-coupler IC5 of the amplifier of FIG. 2, or to the cathode of the LED of the opto-coupler IC3 of the amplifier of FIG. 1, via TP3. The anode of the LED in each case is connected to ground via TP6.

It will be apparent that the above description relates only to two embodiments of the invention, and that the invention encompasses other embodiments as defined by the foregoing Summary of the Invention.

The invention claimed is:

1. A charged particle detector comprising a transresistance amplifier, the transresistance amplifier comprising a variable input resistance, a voltage amplification stage and a controller operable to vary the variable input resistance, wherein the variable input resistance includes a first light-dependent resistance and the controller includes a first variable intensity light source that is optically coupled to the first light-dependent resistance.

2. A charged particle detector according to claim 1, wherein the first light-dependent resistance comprises a light-dependent resistor made from cadmium sulphide, cadmium selenide or another photoconductive material.

3. A charged particle detector according to claim 1, wherein the light-dependent resistance comprises a photodiode.

4. A charged particle detector according to claim 1, wherein the light-dependent resistance comprises a phototransistor.

5. A charged particle detector according to claim 4, wherein the phototransistor is a photo field-effect transistor (photo FET), a channel of which forms the variable input resistance and a gate region of which is optically coupled to the first variable intensity light source.

6. A charged particle detector according to claim 5, wherein the first variable intensity light source comprises a first light-emitting diode (LED).

7. A charged particle detector according to claim 6, wherein the first LED and photo FET both form parts of a first opto-coupler.

8. A charged particle detector according to claim 1, wherein the transresistance amplifier further comprises a second light-dependent resistance, and a second variable intensity light source optically coupled to the second light-dependent resistance, the second light-dependent resistance being electrically connected to the first variable intensity light source, such that variation of the second light-dependent resistance varies a flow of current through the first variable intensity light source.

9. A charged particle detector according to claim 8, wherein the second light-dependent resistance is connected in series with the first variable intensity light source.

10. A charged particle detector according to claim 8, wherein the second light-dependent resistance comprises a phototransistor.

11. A charged particle detector according to claim 10, wherein the second light-dependent resistance comprises a photo bipolar junction transistor (photo BJT), a base region of which is optically coupled to the second variable intensity light source.

12. A charged particle detector according to claim 11, wherein the second variable intensity light source comprises a second LED.

13. A charged particle detector according to claim 12, wherein the second LED and photo BJT both from parts of a second opto-coupler.

14. A charged particle detector according to claim 11, wherein the first variable intensity light source comprises a first LED and the transresistance amplifier further comprises a capacitor electrically connected to the photo BJT so as to form a low-pass filter that passes dc control currents from the photo BJT to the first LED, but attenuates higher frequency noise currents.

15. A charged particle detector according to claim 1, wherein the first variable intensity light source comprises a first LED and the transresistance amplifier further comprises a control circuit having an input circuit operable to generate an input signal representative of a required transresistance of the transresistance amplifier, a signal generator for generating an output current logarithmically related to the input signal, the control circuit being electrically connected to the first or second LED such that the output current flows through said first or second LED to obtain the required transresistance.

16. A charged particle detector according to claim 15, wherein the input circuit comprises a digital-to-analogue converter.

17. A charged particle detector according to claim 1, further comprising an electrode.

18. A charged particle detector according to claim 17, further comprising a voltage source for establishing an electric field in the vicinity of the electrode.

19. An electron microscope comprising a specimen chamber for receiving a specimen, and electron gun, an electron detector according to claim 17, and a video circuit operable to receive an output voltage from the transresistance amplifier and to generate therefrom an image of a specimen.

20. An electron microscope according to claim 19, wherein the transresistance amplifier is contained within the specimen chamber.

* * * * *